US010289071B2

(12) United States Patent
Schlottau et al.

(10) Patent No.: US 10,289,071 B2
(45) Date of Patent: May 14, 2019

(54) INCOHERENT LIGHT TREATMENT (71) Applicant: Akonia Holographics, LLC, Longmont, CO (US)

(72) Inventors: Friso Schlottau, Lyons, CO (US); Adam Urness, Louisville, CO (US); Mark R. Ayres, Boulder, CO (US); Suchit Madan, Boulder, CO (US); Thomas Riley Morris, Longmont, CO (US); Fredric R. Askham, Loveland, CO (US)

(73) Assignee: Akonia Holographics, LLC, Longmont, CO (US)

( * ) Notice: Subject to any disclaimer, the term of this patent is extended or adjusted under 35 U.S.C. 154(b) by 0 days.

(21) Appl. No.: 15/817,122

(22) Filed: Nov. 17, 2017

(65) Prior Publication Data

US 2018/0136606 A1 May 17, 2018

Related U.S. Application Data (60) Provisional application No. 62/423,694, filed on Nov. 17, 2016.

(51) Int. Cl.
*G11B 7/00* (2006.01)
*G03H 1/06* (2006.01)
*G03H 1/04* (2006.01)
*G03F 7/00* (2006.01)
*G03H 1/18* (2006.01)

(52) U.S. Cl.
CPC ............ *G03H 1/06* (2013.01); *G03F 7/0005* (2013.01); *G03H 1/0408* (2013.01); *G03H 1/0486* (2013.01); *G03H 1/182* (2013.01); *G03H 2001/0439* (2013.01); *G03H 2001/185* (2013.01); *G03H 2223/14* (2013.01)

(58) Field of Classification Search
None
See application file for complete search history.

(56) References Cited

U.S. PATENT DOCUMENTS

| | | | | |
|---|---|---|---|---|
| 4,815,800 A * | 3/1989 | Chern | ............ | G03C 1/66 359/13 |
| 5,721,630 A * | 2/1998 | Horner | ............ | G02B 5/0252 359/10 |
| 6,158,245 A * | 12/2000 | Savant | ............ | C03B 19/12 65/17.2 |
| 6,259,561 B1 * | 7/2001 | George | ............ | G02B 5/0221 359/566 |
| 6,344,837 B1 * | 2/2002 | Gelsey | ............ | G02B 27/2228 345/6 |
| 6,870,651 B2 * | 3/2005 | Tutt | ............ | G03H 1/02 359/28 |
| 2004/0004726 A1 * | 1/2004 | Sezginer | ............ | G01B 11/0616 356/601 |
| 2006/0103951 A1 * | 5/2006 | Bell | ............ | G02B 27/46 359/737 |

(Continued)

*Primary Examiner* — Peter Vincent Agustin
(74) *Attorney, Agent, or Firm* — Michael H. Lyons (57) ABSTRACT A system and method of performing incoherent light treatment is disclosed. The method may include securing a recording medium to a securing structure within an internal cavity and delivering light at least partially toward a baffle disposed within the internal cavity. The method may also include securing one or more diffusers to one or more surfaces of the recording medium.

36 Claims, 4 Drawing Sheets (56) References Cited

U.S. PATENT DOCUMENTS

| | | | |
|---|---|---|---|
| 2006/0114553 A1* | 6/2006 | Laudo | B01L 9/06 359/368 |
| 2007/0091768 A1* | 4/2007 | Hori | G11B 7/1378 369/103 |
| 2007/0166625 A1* | 7/2007 | Cole | G03H 1/02 430/1 |
| 2007/0242237 A1* | 10/2007 | Thomas | G02B 27/225 353/94 |
| 2010/0214537 A1* | 8/2010 | Thomas | G02B 27/225 353/7 |
| 2011/0279681 A1* | 11/2011 | Cabib | G01J 5/06 348/164 |
| 2018/0136606 A1* | 5/2018 | Schlottau | G03H 1/06 |

\* cited by examiner

INCOHERENT LIGHT TREATMENT

CROSS-REFERENCE TO RELATED PATENT APPLICATIONS

This application claims priority from U.S. Application No. 62/423,694, filed 17 Nov. 2016, and titled "HIGHLY INCOHERENT LIGHT TREATMENT SYSTEMS AND METHODS OF USE." The above application is incorporated herein by reference for all purposes, in its entirety.

FIELD OF TECHNOLOGY

The present disclosure relates generally to optical reflective devices, and more specifically to light treatment methods for holographic optical elements.

BACKGROUND

Holograms may be implemented within optical media. Challenges associated with proper polymerization of photosensitive material of the optical media may introduce unwanted structures that may perpetuate electromagnetic scattering throughout the optical media and impede image quality associated with holographic recording. Accordingly, improved systems and methods for polymerizing photosensitive material of optical media to promote efficient hologram recording and holographic image quality within optical media treatment are desired.

SUMMARY

The described features generally relate to one or more improved methods, systems, or devices for performing light treatment methods at a recording medium. The recording medium may have one or more holographic recordings recorded therein, which may be referred to as holographic programming. The recording medium may be, treated with collimated and/or diffused light prior to, and/or following holographic programming. Incoherent light treatment mechanisms may be implemented within the light treatment procedure (e.g., optical polymerization) of photosensitive matrix precursors and photoimageable components of the recording medium. The incoherent light treatment may use incoherent light during the light treatment process. An incoherent light treatment may refer to a species of light treatment in which the light beams (e.g., modes) are spatially and/or temporally incoherent and therefore lack phase interrelatedness. Entropic light treatment may substantially consume photoactive components of the recording media and minimize optical scattering bodies and deviations associated with non-uniformities throughout the recording medium.

A method of performing incoherent light treatment is described. The method may include securing a recording medium to a securing structure within an internal cavity and delivering light at least partially toward a baffle disposed within the internal cavity.

A system for performing incoherent light treatment is described. The system may be configured to secure a recording medium to a securing structure within an internal cavity and deliver light at least partially toward a baffle disposed within the internal cavity.

Another system for performing incoherent light treatment is described. The system may include a securing structure configured to secure a recording medium, one or more diffusers operatively coupled to one or more surfaces of the recording medium, and a light source configured to deliver light at least partially toward the one or more diffusers.

Another system for performing incoherent light treatment is described. The system may include a housing defining an internal cavity, a baffle disposed within the internal cavity, a securing structure configured to secure a recording medium, one or more diffusers operatively coupled to one or more surfaces of the recording medium, and a light source configured to deliver light at least partially toward the one or more diffusers. The securing structure may be further configured to reside within the internal cavity at least during operation of the incoherent light system, and the light source may be further configured to deliver light at least partially toward the baffle.

In some examples of the method and system described above, the internal cavity may be substantially spherical. In some examples of the method and system described above, the baffle may be a movable baffle. In some examples of the method and system described above, delivering light at least partially toward a baffle comprises: delivering light at least partially toward a moving baffle disposed within the internal cavity. In some examples of the method and system described above, the baffle may have a generally parabolic shape. In some examples of the method and system described above, a convex surface of the baffle faces a light source disposed within the internal cavity. In some examples of the method and system described above, the baffle may be disposed within the internal cavity such that a light path from a light source disposed within the internal cavity directed toward the securing structure may be at least partially occluded by the baffle.

In some examples of the method and system described above, a movable light source may be disposed within the internal cavity. In some examples of the method and system described above, delivering light at least partially toward a baffle comprises: delivering light via a moving light source toward a baffle disposed within the internal cavity.

Some examples of the method and system described above may further include processes or features for securing one or more diffusers to one or more surfaces of the recording medium. In some examples of the method and system described above, the one or more diffusers may have an index of refraction that may be within 0.10 of an index of refraction of the recording medium. In some examples of the method and system described above, the one or more diffusers may be configured to diffuse light into a surface of the recording medium at one or more angles or incidence corresponding to one or more total internal reflection (TIR) angles of the recording medium. In some examples of the method and system described above, the one or more diffusers may be configured to diffuse light into a surface of the recording medium at a substantially uniform angle of incidence into the recording medium. In some examples of the method and system described above, the one or more diffusers may be configured to diffuse light into a surface of the recording medium at one or more angles of incidence corresponding to one or more angles between the critical angle and surface normal of the recording medium.

In some examples of the method and system described above, the light diffused into the recording medium may have a substantially uniform spatial irradiance. In some examples of the method and system described above, the light diffused into the recording medium may have a substantially uniform temporal irradiance. In some examples of the method and system described above, the light diffused into the recording medium may have a substantially uniform angular distribution. In some examples of the method and system described above, the light diffused into the recording medium may have a substantially circular angular distribution. In some examples of the method and system described above, the non-circular angle distribution may be aligned to a TIR signal light propagation angle to reduce scatter or haze.

Some examples of the method and system described above may further include processes or features for moving the one or more movable diffusers within the internal cavity. Some examples of the method and system described above may further include processes or features for delivering light at least partially toward the one or more moving diffusers.

In some examples of the method and system described above, the light diffused into the recording medium may have a substantially non-circular angle distribution. In some examples of the method and system described above, the one or more diffusers may be one or more movable diffusers.

In some examples of the method and system described above, at least one light source for delivering light may be configured to deliver light having a center wavelength less than 450 nm. In some examples of the method and system described above, at least one light source for delivering light may be configured to deliver light having a bandwidth of at least 10 nm. In some examples of the method and system described above, each of at least two light sources for delivering light may be configured to deliver substantially coherent light having a bandwidth approximately 10 nm or less.

In some examples of the method and system described above, a light source for delivering light may be configured to deliver light of a uniform irradiance of approximately 50 mW/cm2 to the recording medium.

In some examples of the method and system described above, the recording medium comprises a hologram. In some examples of the method and system described above, a wavelength used by a recording beam to form the hologram may be approximately a same wavelength as a wavelength of the delivered light.

In some examples of the method and system described above, delivering light at least partially toward a baffle comprises: delivering light at least partially toward a baffle disposed within the internal cavity for at least 2.5 minutes for interaction with chemically active components of the recording medium. In some examples of the method and system described above, delivering light at least partially toward a baffle comprises: delivering light at least partially toward a baffle disposed within the internal cavity for at least 10 minutes for interaction with chemically active components of the recording medium.

In some examples of the method and system described above, delivering light at least partially toward a baffle comprises: delivering light at least partially toward a baffle disposed within the internal cavity corresponding to a dose of approximately 20 Joules. In some examples of the method and system described above, delivering light at least partially toward a baffle comprises: delivering light at least partially toward a baffle disposed within the internal cavity for at duration for a duration corresponding to a time when chemically active components of the recording medium may be rendered substantially inactive such that the recording medium may be no longer photosensitive.

In some examples of the method and system described above, the light delivered into the recording medium may be substantially spatially incoherent light.

BRIEF DESCRIPTION OF THE DRAWINGS

A further understanding of the nature and advantages of implementations of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Holographic optical elements may be constructed from substrates composed and oriented to sustain an imaging architecture for processing a component mixture (e.g., medium mixture). The medium mixture may sustain a liquid state with up to a temperature threshold and may contain support matrix (e.g., polymeric material) precursors. The composition of substrates may be referred to as an optical recording cell and the imaging architecture may sustain a high degree of parallelism throughout the substrates.

The medium mixture may include a matrix precursor configured to polymerize to form a matrix polymer, along with a photoimageable system. In some embodiments, the matrix polymer can be referred to as a support matrix. The medium mixture is generally a liquid at 20° C. After casting, matrix precursors typically polymerize approximately to completion to form the matrix polymer. The resulting composition, now referred to as a recording medium, is typically no longer a liquid at 20° C. The recording medium is usually a solid or elastomer at 20° C. and includes a photoimageable system as described above, along with the matrix polymer. Typically, but not necessarily, medium mixture embodiments include matrix precursors such as a polyol and an isocyanate, polymerization of which results in a matrix polymer comprising a polyurethane.

The photoimageable system may comprise a photoactive monomer and an initiator, and the matrix polymer typically comprises a cross-linked support matrix. In some embodiments, the photoimageable system further comprises a terminator. The matrix precursor and the photoimageable system (or the polymers generated therefrom) are typically compatible with each other, and thus avoid phase separation before or after polymerization of either of the matrix precursor or the photoimageable system. The matrix precursor and photoimageable systems furthermore polymerize by reactions sufficiently independent from each other that the photoimageable system remains photosensitive and substantially unpolymerized after formation of the matrix polymer, but prior to exposure to photoinitiating light. Polymerization of the matrix precursors typically commences upon mixing of medium mixture components, and proceeds substantially to completion at room temperature. Photoinitiation and/or elevated temperatures are typically not required to initiate or sustain formation of the matrix polymer.

The photoimageable system may be configured to form a photopolymer upon light induced polymerization (e.g., photopolymerization). Introduction of the recording beams typically induces polymerization of the photoimageable system to generate a photopolymer. The photopolymer may be, but is not necessarily, covalently bound to the support matrix. However, the photoimageable system of recording medium may be susceptible to scattering bodies throughout the recording medium, particularly in high dynamic ranges. Scattering bodies may be promoted according to localized non-uniformities and/or deviable properties of the matrix polymer and/or photopolymer. Furthermore, molecular oxygen within the recording medium may interfere with photopolymerization and impede hologram recording within the medium.

Incoherent light may be applied during a photopolymerization process to reduce the amount of scatter otherwise caused by light treatment of the photosensitive optical recording medium. Incoherent light may refer to spatially and/or temporally incoherent light beams (e.g., modes) that lack phase interrelatedness (e.g., an equivalent frequency implying a constant phase difference) at the emitted modes. Spatial incoherence may correspond to a lack of correlation between distinct points, in the extent of one or more mode waveforms. Temporal incoherence may correspond to a lack of correlation at a single reference point during disparate temporal instances. Entropic mechanisms of the incoherent light may substantially consume photoactive or light absorbing components of the recording media, and minimize optical scattering associated with unintended perturbations and/or deviations throughout the recording medium. In some cases, an incoherent light treatment process may be initiated prior to holographic programming at the recording medium, and referred to as pre-recording light treatment. Pre-recording light treatment may consume molecular oxygen in the media and dispose of photochemical impedances to holographic recording at the recording medium. Additionally or alternatively, another incoherent light treatment process may be implemented post holographic programming, and reduce light scatter within the photopolymerization process of the constructed holographic optical element.

As described herein, the following descriptions, methods and/or implementations may be provided to support efficient incoherent light treatment integration with photopolymerization of a photosensitive optical recording medium. Incoherent light may be distributed at a volumetrically uniform intensity across a broad angular bandwidth, in accordance with a high degree of optical entropy. In some cases, a static band of light emitting diodes may emit or deliver one or more modes (e.g., typically many modes of light) that are subsequently collimated and traversed through a diffusive body to reduce coherence. The one or more modes may be directed by one or more oriented mirrors and may be incident on a lenslet array imaged to the recording medium. In other cases, a set of light emitting diodes may direct one or more modes into an internal cavity of an integrating sphere. The broad angular bandwidth of the diodes, as well as the angular range of the integrating sphere may create a volumetrically uniform intensity distribution substantially spanning the angular range of the reflective medium in entirety. The integrating sphere may include a movable baffle comprising at least diffusely reflective elements. Further, the integrating sphere may include diffusive elements index-matched to the recording medium. Each of the baffle and diffusive elements may ensure increased optical entropy for substantially treating scatter bodies of the holographic optical element. Each of the embodied methods and systems may aid in optimizing optical transparency and image quality of the holographic optical element.

The one or more holographic optical element type components or devices may be employed in a light coupling device (e.g., an input coupler, an output coupler, and/or a cross coupler). Utilizing holographic optical element technology in the one or more light coupling devices may improve viewing capability and optical clarity of an associated image projection. A holographic optical element type device may exhibit achromatic characteristics. A holographic optical element type device (e.g., an output coupler embodiment) may be Bragg-mismatched to one reflection of total internal reflection (TIR) mode input light that is reflected between substrates and to input light passing straight through the holographic optical element type device (e.g., external light incident on a substrate). The hologram recordings may be configured to reflect light, of a wavelength, about a reflective axis offset from surface normal of the structure, at a plurality of particular incident angles. Aspects of the disclosure are further illustrated by and described with reference to apparatus diagrams, system diagrams, and flowcharts that relate to manufacturing holographic optical elements.

The aforementioned description provides examples, and is not intended to limit the scope, applicability or configuration of implementations of the principles described herein. Rather, the ensuing description will provide those skilled in the art with an enabling description for implementing implementations of the principles described herein. Various changes may be made in the function and arrangement of elements.

Thus, various implementations may omit, substitute, or add various procedures or components as appropriate. For instance, it should be appreciated that the methods may be performed in an order different than that described, and that various steps may be added, omitted or combined. Also, aspects and elements described with respect to certain implementations may be combined in various other implementations. It should also be appreciated that the following systems, methods, devices, and software may individually or collectively be components of a larger system, wherein other procedures may take precedence over or otherwise modify their application.

Figure 1:
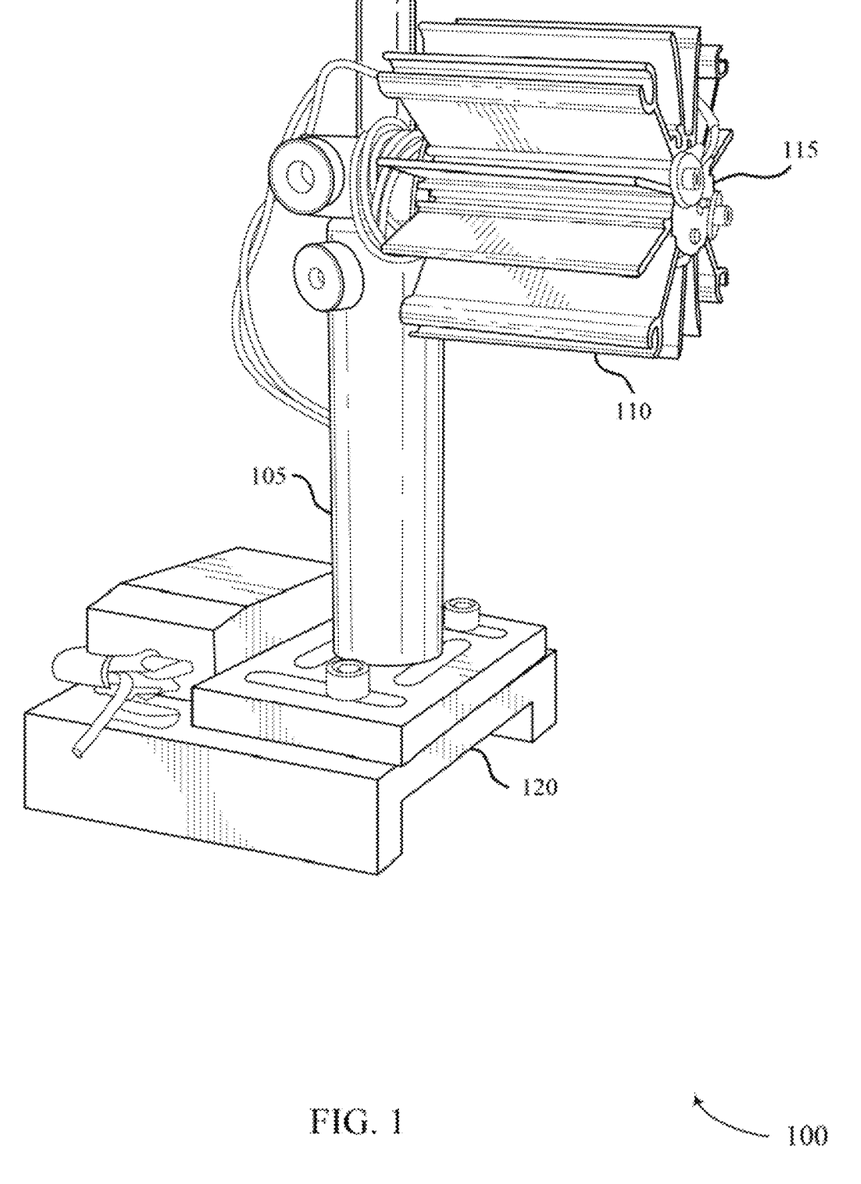
FIG. 1 illustrates a diagram of a system that can be used for performing light treatment in accordance with various aspects of the present disclosure.

FIG. 1 illustrates a light treatment system 100 for performing light treatment in accordance with various aspects of the present disclosure. System 100 may include an arm 105, a bank mechanism 110, a mount 120, and one or more light emitting diodes 115 oriented in accordance to the dimensions of bank mechanism 110.

System 100 may be positioned a configured distance from a recording medium (not shown) and stabilized via a mount 120. Each of the one or more light emitting diodes 115 may direct illuminating light to a proximal recording medium. The one or more light emitting diodes 115 may perform incoherent light treatment and contained within a photoimageable system of the recording medium. Arm 105 may be adjustable by height, lateral translation, and/or angular offset according to a reference axis for variant orientation of bank mechanism 115 to the proximal recording medium. Each of the one or more light emitting diodes 115 configured at bank mechanism 110 may emit propagating light beams (e.g., modes) directed to a specified locale of the recording medium. In some cases, the emitted modes may be substantially collimated and directed through one or more diffusers to the recording medium. The diffusers may be static in association with system 100 or may be configured to move at one or more variant offsets. Diffusion of the modes may reduce spatial and/or temporal coherence, and therefore support mitigation of scatter bodies associated with unintended perturbations of the recording medium. For example, substantially collimated illumination may provide a beam toward the recording medium and the diffusers may reduce the spatial coherence in close proximity to the recording medium to maintain uniform intensity.

In some cases, the one or more light emitting diodes 115 may emit or deliver light of substantially uniform intensity for light treatment at the recording medium, prior to holographic programming. Modes of the emitted light associated with the one or more diodes 115 may correspond to a configured wavelength range. One or more reflective components (not shown) may be implemented to direct the emitted light to a lenslet array and measure the output intensity of the one or more diodes 115. The lenslet array and/or the one or more diffusers may configure one or more spatial properties of the modes, including an angular range for light treatment at the recording medium. A pre-recording light treatment may consume molecular oxygen in the media and dispose of photochemical impedances to polymerization of the photoimageable system.

Additionally, the one or more light emitting diodes 115 may direct incoherent light to the recording medium subsequent to holographic programming. In some cases, one or more reflective components (not shown) may be implemented to configure spatial properties of the modes, including an angular range for light treatment at the recording medium. The emitted light may promote photoinitiator consumption at the recording medium, which may, but does not necessarily, induce photopolymerization. Entropic mechanisms, both inherent to the incoherent light and associated with integrated diffusive components, may substantially consume photoactive or light absorbing components of the recording media throughout the dynamic range of the holographic recordings, and minimize optical scattering associated with unintended perturbations and/or deviations throughout the recording medium.

Figure 2:
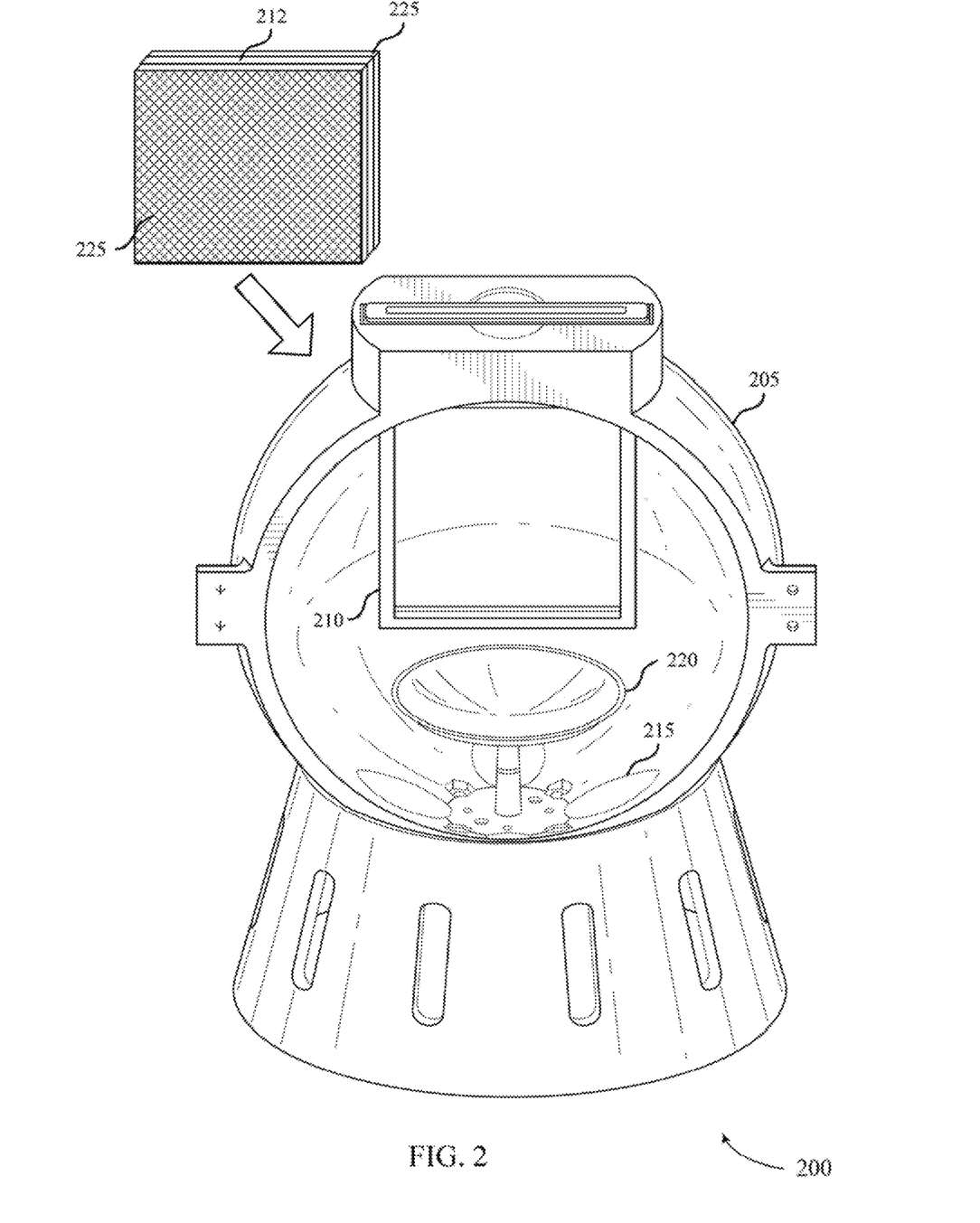
FIG. 2 illustrates a diagram of a system that can be used for performing light treatment in accordance with various aspects of the present disclosure.

FIG. 2 illustrates a light treatment system 200 for performing light treatment in accordance with various aspects of the present disclosure. Light treatment system 200 may implement one or more methods or features associated with incoherent light treatment, as described in FIG. 1. System 200 may include a securing structure 210 integrated within a cavity 205. As illustrated, cavity 205 may exhibit spherical geometric properties. System 200 may further include one or more (e.g., a bank) light emitting diodes 215, a baffle 220 (e.g., light deflecting enclosure material) oriented in proximity to the one or more light emitting diodes 215 as a technique for blocking at least zeroth-order stray light paths of the emission.

In some implementations, securing structure 210 may be abutted to an internal surface region of cavity 205. A pair of substrate edges of the securing structure 210 may be substantially parallel, and include an adjacent edge implemented at a distal end (i.e., with reference to the internal surface region of cavity 205) of the pair of substrate edges, as a means to at least preserve orthogonal corners within securing structure 210. A recording cell (e.g., an optical element including a recording medium between two substrates) may be inserted into cavity 205, via an input aperture and inset within securing structure 210. In some cases, the input aperture may then be closed and/or sealed. Securing structure 210 may stabilize the recording cell, and sustain parallelism of the one or more substrate materials contained within the recording cell, including a photosensitive optical recording medium. One or more reflective and/or absorptive components may be implemented at the securing structure 210, for protecting an inset recording cell 212 from at least incidental optical interference. For example, each of the one or more substrate edges of securing structure 210 may include one or more reflective coatings (e.g., a diffusing, low absorption coating such as, but not limited to, a Barium sulfate-based coating) for diverting light of the cavity 205 away from the one or more substrate edges of a recording cell 212 inset within securing structure 210. Similarly, each of the one or more substrate edges of securing structure 210 may include one or more partially and/or fully absorptive coatings for diverting stray light of the cavity 205 away from the one or more substrate edges of a recording cell 212 inset within securing structure 210.

In other implementations, securing structure 210 may be inset within cavity 205. In some cases, securing structure 210 may be abutted to an internal surface region of cavity 205. In other cases, securing structure 210 may be oriented within the internal volume of cavity 205, and supported by one or more additional media components (not shown). Cavity 205 may include a hinge or joint that supports angular displacement between substrate portions of cavity 205, adjoined to the hinge. The angular displacement may correspond to an entrance aperture of the cavity 205. A recording cell 212 may be inserted through the entrance aperture and inset within securing structure 210. Securing structure 210 may stabilize the recording cell 212, and sustain parallelism of the one or more substrate materials contained within the recording cell 212, including a photosensitive optical recording medium. The substrate portions of cavity 205 may then be adjoined, closing and/or sealing the common boundary between the substrate portions. One or more reflective and/or absorptive components may be implemented at the securing structure 210, for protecting an inset recording cell 212 from at least incidental optical interference. For example, each of the one or more substrate edges of securing structure 210 may include one or more dielectric coatings for diverting stray light of the cavity 205 away from the one or more substrate edges of a recording cell 212 inset within securing structure 210. Similarly, the one or more substrate edges of securing structure 210 may include one or more partially and/or fully absorptive coatings for diverting stray light of the cavity 205 away from the one or more substrate edges of a recording cell 212 inset within securing structure 210.

One or more light emitting diodes 215 may illuminate the encapsulating cavity 205 with incoherent light. Each of the one or more light emitting diodes 215 may emit or deliver modes corresponding to a configured wavelength and or broad angular bandwidth. In some examples, a first light emitting diode of the one or more light emitting diodes 215 may have a first center wavelength of light (e.g., 405 nm), and a second light emitting diode of the one or more light emitting diodes 215 may have a second wavelength of light (e.g., 380 nm).

The combination of the angular bandwidth of the emitted modes and the geometric properties (i.e., volumetric uniformity) of cavity 205 may promote a volumetrically uniform intensity distribution, propagating modes throughout the entire angular spectrum. Entropic mechanisms, both inherent to the incoherent light and associated with volumetric properties of the cavity 205, may substantially consume photoactive or light absorbing components of the recording media throughout the dynamic range of the holographic recordings, and minimize optical scattering associated with unintended perturbations and/or deviations throughout the recording medium. In some embodiments, holograms or other images recorded in the recording medium may be "latent," such that post-recording light treatment results in stronger holograms or images. For example, a latent hologram may exhibit diffraction efficiency after it is recorded but prior to light treatment that is only a fraction (e.g., less than half, and in some embodiments less than a tenth) of the diffraction efficiency it exhibits after post-recording light treatment.

In some embodiments, at least one baffle 220 may be disposed within the cavity 205. The baffle may be generally parabolic and include one or more convex sub-surfaces. Baffle 220 may be statically oriented within cavity 205, or movable throughout the internal volume of cavity 205. Baffle 220 may be used to augment optical entropy (i.e., lower spatial and/or temporal coherence) of the incoherent light emitted by one or more diodes 215.

Additionally or alternatively, in some embodiments, one or more diffusers 225 may be integrated within cavity 205 in some manner. The one or more diffusers 225 may contain polymer and/or glass substrate materials, and may be index-matched to the optical recording medium of a recording cell 212 inset within securing structure 210. In particular, in some cases, small amounts of index-matched fluid may be integrated at a surface (e.g., a glass interface) of each of the one or more diffusers 225. In other cases, at least a portion (e.g., a small portion approximately the size and shape of securing structure 210) of the internal volume of cavity 205 may contain index-matched fluid, bathing at least the one or more diffusers 225. The one or more diffusers 225 may support mode scattering into the recording medium at one or more angles unconstrained by normal refractive properties within cavity 205.

In some examples, the recording cell 212 may be disposed between two diffusers 225. In some cases, the one or more diffusers 225 are adhered to the recording cell 212 after being inset within securing structure 210. In other cases, the one or more diffusers 225 are adhered to the recording cell 212 prior to being inset within securing structure 210.

The one or more diffusers 225 may be of varying shape. For example, a diffuser may include a circularly symmetric Gaussian or flat top structure. A Gaussian or flat top structure may aid in providing light diffused into the recording medium that has a substantially circular angular distribution. In some cases, two diffusers may produce a generally $4\pi$ steradian cure structure. A generally $4\pi$ steradian cure structure may aid in providing light diffused into the recording medium that has a substantially uniform angular intensity.

In some cases, a diffuser may include a non-circularly symmetric structure. For example, a line diffuser may increase the angular extent of input light substantially in one dimension while leaving it substantially unmodified in the orthogonal dimension. Such a line diffuser could thus diffuse light into the recording medium with generally ±90° angular extent in the diffusing dimension, while leaving the angular extent generally lower than the critical angle (about ±42°) in the orthogonal dimension. In some cases the orthogonal dimension may be aligned with a propagation direction of TIR signal light for the finished recording cell so that propagation angles for TIR signal light do not substantially overlap propagation angles for incoherent light treatment. In some cases the prevention of such overlap may reduce the incidence of cure-induced noise gratings that are Bragg-matched to TIR signal light, thus reducing scatter and haze and improving signal-to-noise ratio. In other cases, other non-circularly symmetric diffuser structures may be employed, or other alignments between diffuser angles and TIR or non-TIR signal light angles may be used to achieve some end.

In some cases, baffle 220 may be movable and provides some "de-cohering" of the injected light. Other techniques of de-cohering light include using the cavity 205 with baffle 220 that is stationary, and moving the one or more light emitting diodes 215 or other light source (e.g., lasers). For example, rotational motion around a center axis, circular motion, linear oscillating motion, etc. may be used with respect to the one or more light emitting diodes 220. In other examples, the cavity 205 may include one or more light emitting diodes 220 that are stationary, and the one or more diffusers 225 may be moving to ensure all light within the cavity has passed through the moving diffusers.

Each of the propagating modes may be incident at the optical recording medium until all active components (e.g., photoinitiators) of the recording medium polymer are entirely consumed and the recording medium is no longer photosensitive, completing photopolymerization. In some cases, the recording medium may be treated by the illuminated light of diodes 215 for a configured temporal duration of the system 200. In other cases, one or more sensors and/or indicator components (not shown) may calculate photopolymerization completion at the recording medium which may subsequently be transmitted and processed by a coupled processor of the system 200. The implementation of incoherent light treatment, within cavity 205, for photopolymerization at the recording medium improves scatter performance associated with unintended aberrations to the recording medium. Scatter performance may be quantified via measurement mechanisms (e.g., a haze meter) implemented with system 200. As described herein, implementation of incoherent light treatment at a holographically programmed recording medium, in comparison to divergent sample conditions, may yield results identified in TABLE 1.

TABLE 1

| Sample Type | No Sample | Static LED Treatment to Recording Medium Sample | Clean Substrate Only | Omni Incoherent Light Treatment to Recording Medium Sample |
|---|---|---|---|---|
| Scatter (nW) | 25 | 58220 | 83 | 156 - Approximate average |
| % Haze | 0% -defined | 100% -defined | 0.1% | 0.22% |

As shown in the example of TABLE 1, optical scattering may be measured according to electromagnetic power, expressed in nanowatts (nW). Haze may refer to a measure of light scattering calculated according a percentage of diffusive transmittance, in terms of total transmittance. The calculated values, as shown in TABLE 1, reveal that implementation of incoherent light treatment to recording media provide substantially reduce scatter in comparison to statically treated recording media. (i.e., approximate scatter of 156 nW in comparison to 58,220 nW). Furthermore, incoherent treatment provides scatter reduction comparable to optical media substrates absent of any holographic programming.

Figure 3A:
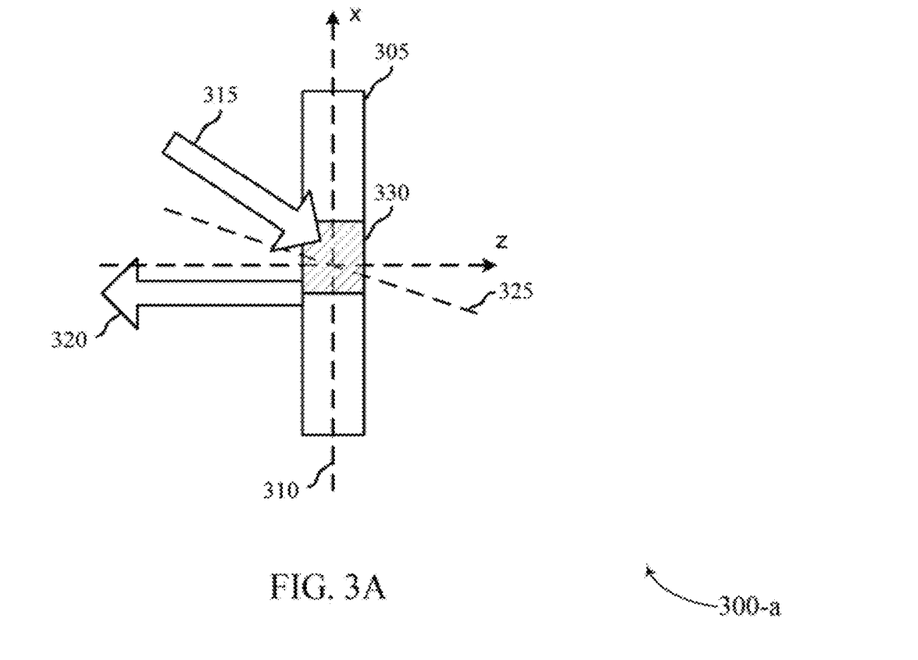
FIG. 3A is a diagram illustrating reflective properties of a holographic optical element in real space in accordance with various aspects of the disclosure.

FIG. 3A is a cross-section view 300 illustrating reflective properties of a holographic optical element 305 in real space, according to one example that supports performing light treatment in accordance with various aspects of the present disclosure. The cross-section view 300 may include one or more recorded holograms, such as hologram 330, in a recording medium. One or more incoherent light treatment methods may be implemented prior to, and/or subsequent to, programming of the one or more recorded holograms. FIG. 3A omits holographic optical element components other than the recording medium, such as an additional layer that might serve as a substrate or protective layer for the recording medium. The substrate or protective layer may serve to protect the recording medium from contamination, moisture, oxygen, reactive chemical species, damage, and the like. In some embodiments, one or more holographic optical elements may be configured or structured to selectively reflect the rays of light to various portions of an optical device (e.g., redirecting light toward a waveguide in an input coupler configuration, redirecting light propagating in a TIR mode within a waveguide in a cross coupler configuration, and/or forming an exit pupil towards an eye box of the optical device). The holographic optical element may be configured to avoid reflecting the rays of light for certain incidence angles. Implementations of some holographic optical element embodiments may require a relatively high dynamic range recording medium to achieve high reflectivity over a relatively wide wavelength bandwidth and angle range for the resulting recording medium. By contrast, a holographic optical element may require less dynamic range thereby allowing each hologram to be stronger (e.g., recorded with a greater intensity and/or longer exposure time). A holographic optical element composed of stronger holograms may provide a brighter image, or allow a dimmer light projector to provide an image of similar brightness. The holographic optical element 305 may be characterized by reflective axis 325, at an angle measured with respect to the z-axis. The z-axis may be normal to the holographic optical element surface. The holographic optical element 305 is illuminated with the incident light 315-a with an internal incidence angle that is measured with respect to the z-axis. The principal reflected light 320 may be reflected with internal reflection angle 180' measured with respect to the z-axis. The principal reflected light 320 may correspond to wavelengths of light residing in the red, green, and blue regions of the visible spectrum.

The holographic optical element 310 may be characterized by the reflective axis 325, at an angle measured with respect to the z-axis. The z-axis is normal to the holographic optical element 305 axis. The holographic optical element 310 is illuminated with the incident light 315-a with an internal incidence angle that is measured with respect to the z-axis. The principal reflected light 320 may be reflected with internal reflection angle axis substantially normal to the surface of holographic optical element 310. In some examples, the principal reflected light 320 may correspond to wavelengths of light residing in the red, green, and blue regions of the visible spectrum. For example, the red, green, and blue regions of the visible spectrum may include a red wavelength (e.g., 610-780 nm) band, green wavelength (e.g., 493-577 nm) band, and blue wavelength (e.g., 405-492 nm) band. In other examples, the principal reflected light 320 may correspond to wavelengths of light residing outside of the visible spectrum (e.g., infrared and ultraviolet wavelengths).

The holographic optical element 310 may have multiple hologram regions which all share substantially the same reflective axis 325. These multiple regions, however, may each reflect light for different ranges of angles of incidence. For example, the bottom third of a HOE containing the holographic optical element 310 may only contain that subset of hologram recordings that reflects light upwards towards a corresponding eye box. The middle third may then reflect light directly towards the corresponding eye box. Then the top third need only contain the subset of hologram recordings which reflects light downwards to the corresponding eye box.

Figure 3B:
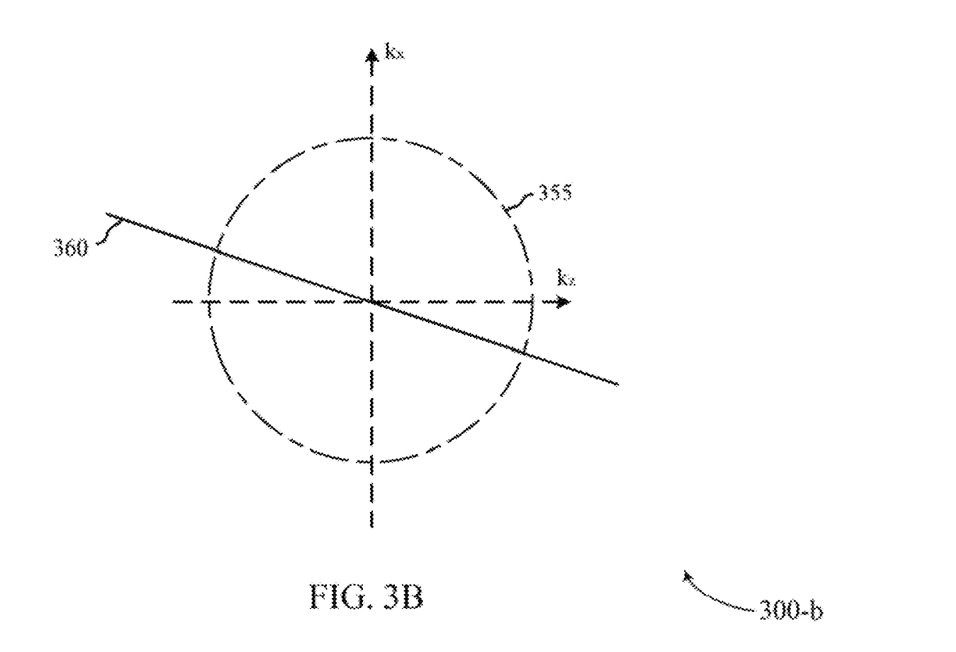
FIG. 3B illustrates a holographic optical element in k-space in accordance with various aspects of the disclosure.

FIG. 3B illustrates a k-space representation 350 of the holographic optical element 310 of FIG. 3A. The k-space distributions of spatially varying refractive index components are typically denoted $\Delta n(\bar{k})$. $\Delta n(\bar{k})$ k-space distribution 320-a may pass through the origin, at an angle equal to reflective axis 325, measured with respect to the z-axis. Recording k-sphere 355-a may be the k-sphere corresponding to a particular writing wavelength. K-space representation 350 may include various k-spheres corresponding to wavelengths of light residing in the red, green, and blue regions of the visible spectrum.

The k-space formalism may represent a method for analyzing holographic recording and diffraction. In k-space, propagating optical waves and holograms may be represented by three dimensional Fourier transforms of their distributions in real space. For example, an infinite collimated monochromatic reference beam may be represented in real space and k-space by equation (1):

$$E_r(\bar{r}) = A_r \exp(i \bar{k}_r \cdot \bar{r}) \xrightarrow{\mathfrak{I}} E_r(\bar{k}) = A_r \delta(\bar{k} - \bar{k}_r) \quad (1)$$

where $E_r(\bar{r})$ is the optical scalar field distribution at all $\bar{r} = \{x, y, z\}$ 3D spatial vector locations, and the transform $E_r(\bar{k})$ of the distribution, is the optical scalar field distribution at all $\bar{k} = \{k_x, k_y, k_z\}$ 3D spatial frequency vectors. $A_r$ may represent the scalar complex amplitude of the field; and $\bar{k}_r$ may represent the wave vector, whose length indicates the spatial frequency of the light waves, and whose direction indicates the direction of propagation. In some implementations, all beams may be composed of light of the same wavelength, so all optical wave vectors may have the same length, i.e., $|\bar{k}_r| = k_n$. Thus, all optical propagation vectors may lie on a sphere of radius $k_n = 2\pi n_0/\lambda$, where $n_0$ is the average refractive index of the hologram ("bulk index"), and $\lambda$ is the vacuum wavelength of the light. This construct is known as the k-sphere. In other implementations, light of multiple wavelengths may be decomposed into a superposition of wave vectors of differing lengths, lying on different k-spheres.

Another important k-space distribution is that of the holograms themselves. Volume holograms may consist of spatial variations of the index of refraction within a recording medium. The index of refraction spatial variations, typically denoted $\Delta n(\bar{r})$, can be referred to as index modulation patterns, the k-space distributions of which may be denoted $\Delta n(\bar{k})$. The index modulation pattern may be created by interference between a first recording beam and a second recording beam is typically proportional to the spatial intensity of the recording interference pattern, as shown in equation (3):

$$\Delta n(\bar{r}) \propto |E_1(\bar{r}) + E_2(\bar{r})|^2 = |E_1(\bar{r})|^2 + |E_2(\bar{r})|^2 + E_1^*(\bar{r}) E_2(\bar{r}) + E_1(\bar{r}) E_2^*(\bar{r}) \quad (3)$$

where $E_1(\bar{r})$ is the spatial distribution of the signal first recording beam field and $E_2(\bar{r})$ is the spatial distribution of the second recording beam field. The unary operator * denotes complex conjugation. The final term in equation (3), $E_1(\bar{r})E_2^*(\bar{r})$, may map the incident second recording beam into the diffracted first recording beam. Thus the following equation may result:

$$E_1(\bar{r})E_2^*(\bar{r}) \xrightarrow{\mathfrak{I}} E_1(\bar{k}) \otimes E_2(\bar{k}), \qquad (3)$$

where $\otimes$ is the 3D cross correlation operator. This is to say, the product of one optical field and the complex conjugate of another in the spatial domain may become a cross correlation of their respective Fourier transforms in the frequency domain.

Typically, the hologram 330 constitutes a refractive index distribution that is real-valued in real space. $\Delta n(\bar{k})$ locations of k-space distributions of the hologram 330 may be determined mathematically from the cross-correlation operations $E_2(\bar{k}) \otimes E_1(\bar{k})$ and $E_1(\bar{k}) \otimes E_2(\bar{k})$, respectively, or geometrically from vector differences $\bar{K}_{G+} = \bar{k}_1 - \bar{k}_2$ and $\bar{K}_{G-} = \bar{k}_2 - \bar{k}_1$, where $\bar{K}_{G+}$ and $\bar{K}_{G-}$ may represent grating vectors from the respective hologram $\Delta n(\bar{k})$ k-space distributions to the origin (not shown individually). Note that by convention, wave vectors are represented by a lowercase "k," and grating vectors by uppercase "K."

Once recorded, the hologram 330 may be illuminated by a probe beam to produce a diffracted beam. For purposes of the present disclosure, the diffracted beam can be considered a reflection of the probe beam, which can be referred to as an incident light beam (e.g., image-bearing light). By subjecting hologram 330 (and like holograms in a recording medium) to an incoherent light treatment, the reflection of the probe beam may result in a clearer reflected image. The probe beam and its reflected beam may be angularly bisected by the reflective axis 325-a (i.e., the angle of incidence of the probe beam relative to the reflective axis has the same magnitude as the angle of reflection of the reflected beam relative to the reflective axis). The diffraction process can be represented by a set of mathematical and geometric operations in k-space similar to those of the recording process. In the weak diffraction limit, the diffracted light distribution of the diffracted beam is given by equation (4), $$E_d(\bar{k}) \propto \Delta n(\bar{k}) * E_p(\bar{k})|_{|k|=k_n}, \qquad (4)$$

where $E_d(\bar{k})$ and $E_p(\bar{k})$ are k-space distributions of the diffracted beam and the probe beam, respectively; and "*" is the 3D convolution operator. The notation "$|_{|k|=k_n}$" indicates that the preceding expression is evaluated only where $|\bar{k}|=k_n$, i.e., where the result lies on the k-sphere. The convolution $\Delta n(\bar{k}) * E_p(\bar{k})$ represents a polarization density distribution, and is proportional to the macroscopic sum of the inhomogeneous electric dipole moments of the recording medium induced by the probe beam, $E_p(\bar{k})$.

In some cases, when the probe beam resembles one of the recording beams used for recording, the effect of the convolution may be to reverse the cross correlation during recording, and the diffracted beam may substantially resemble the other recording beam used to record a hologram. When the probe beam has a different k-space distribution than the recording beams used for recording, the hologram may produce a diffracted beam that is substantially different than the beams used to record the hologram. Note also that while the recording beams are typically mutually coherent, the probe beam (and diffracted beam) is not so constrained. A multi-wavelength probe beam may be analyzed as a superposition of single-wavelength beams, each obeying Equation (4) with a different k-sphere radius.

Persons skilled in the art given the benefit of the present disclosure will recognize that the term probe beam, used when describing holographic optical element properties in k-space, is analogous to the term incident light, which is used when describing holographic optical element reflective properties in real space. Similarly, the term diffracted beam, used when describing holographic optical element properties in k-space, is analogous to the term principal reflected light, used when describing holographic optical element properties in real space. Thus when describing reflective properties of a holographic optical element in real space, it may be typical to state that incident light is reflected by a hologram (or other hologram recording) as principal reflected light, though to state that a probe beam is diffracted by the hologram to produce a diffracted beam is synonymous. Similarly, when describing reflective properties of a holographic optical element in k-space, it is typical to state that a probe beam is diffracted by a hologram (or other hologram recording) to produce a diffracted beam, though to state that incident light is reflected by the hologram recording to produce principal reflected light has the same meaning in the context of implementations of the present disclosure.

Figure 4:
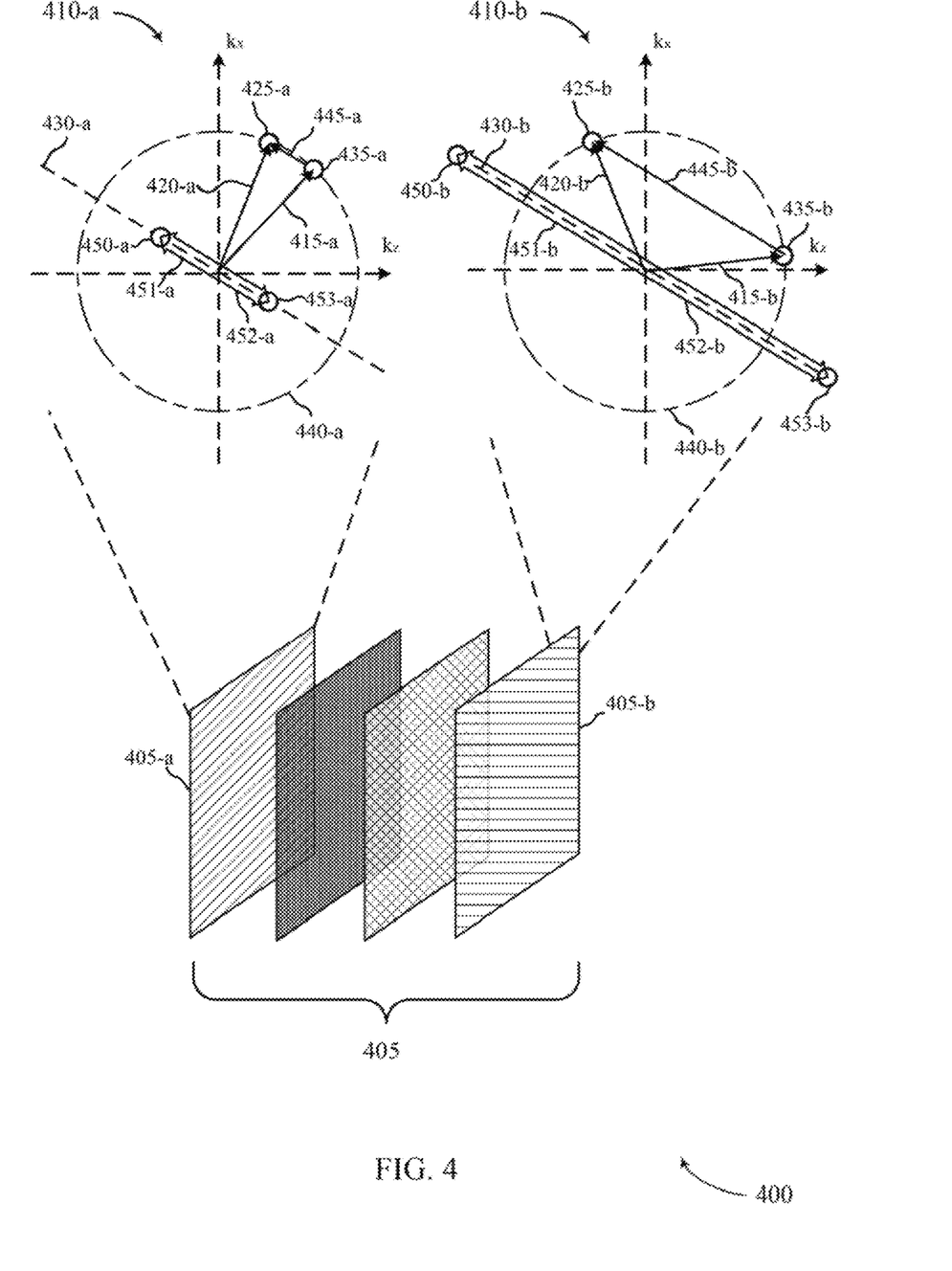
FIG. 4 is a diagram of an optical component illustrating a plurality of hologram recordings in accordance with various aspects of the disclosure.

FIG. 4 is a diagram of an optical component 400 illustrating a plurality of hologram recordings 405 that support performing light treatment in accordance with various aspects of the present disclosure. Hologram recordings 405 may be similar to the hologram recordings with a recording medium described herein. In some cases, hologram recordings 405 may be referred to as grating structures for reflecting light at a given wavelength, angle of incidence, or the like. Hologram recordings 405 are illustrated in an exploded view manner for discussion purposes, but these hologram recordings 405 may overlap and intermingle within a volume or space of a recording medium as described herein. Similarly, each of the hologram recordings 405 may be applied at spatial portions of a recording medium subject to a spatial disparity. Also, each hologram recording may have a different diffraction angle response and may reflect light at a wavelength that is different than another hologram recording. One or more incoherent light treatment methods may be implemented prior to, and/or subsequent to, programming of the one or more recorded holograms.

Optical component 400 depicts a hologram recording 405-a and a hologram recording 405-b. The hologram recording 405-a may have a corresponding k-space diagram 410-a, and the hologram recording 405-b may have a corresponding k-space diagram 410-b. The k-space diagrams 410-a and 410-b may illustrate cases of Bragg-matched reconstruction by illuminating a hologram.

The k-space diagram 410-a may illustrate the reflection of an incident light by the hologram recording 405-a. The k-space diagram 410-a is a representation of a mirror-like diffraction (which can be referred to as a reflection) of the probe beam by the hologram, where the probe beam angle of incidence with respect to the reflective axis is equal to the diffracted beam angle of reflection with respect to the reflective axis. The k-space diagram 410-a may include positive sideband $\Delta n(\hat{k})$ k-space distribution 450-a that has an angle measured with respect to the z-axis, equal to that of the reflective axis 430-a of the hologram recording 405-a. The k-space diagram 410-a may also include a negative sideband $\Delta n(\hat{k})$ k-space distribution 453-a that has an angle measured with respect to the z-axis, equal to that of the reflective axis 430-a. The k-sphere 440-a may represent visible blue light, visible green light, or visible red light.

The k-space diagram 410-a depicts a case where probe beam 435-a produces a diffracted beam k-space distribution 425-a, $E_d(\bar{k})$, that is point-like and lies on the probe beam 440-a k-sphere. The diffracted beam k-space distribution 425-a is produced according to the convolution of Equation (4).

The probe beam may have a k-space distribution 435-*a*, $E_p(\bar{k})$, that is also point-like. In this case, the probe beam is said to be "Bragg-matched" to the hologram, and the hologram may produce significant diffraction, even though the probe beam wavelength differs from the wavelength of the recording beams used to record the hologram. The convolution operation may also be represented geometrically by the vector sum $\bar{k}_d = -\bar{k}_p + \bar{K}_{G+}$, where $\bar{k}_d$ represents a diffracted beam wave vector 420-*a*, $\bar{k}_p$ represents a probe beam wave vector 415-*a*, and $\bar{K}_{G+}$ represents a positive sideband grating vector 451-*a*. Vector 445-*a* represents the sum of the probe beam wave vector 415-*a* and the positive sideband grating vector 451-*a* according to the convolution of Equation (4). The k-space diagram 410-*a* also has a negative sideband grating vector 452-*a*.

The probe beam wave vector 415-*a* and the diffracted beam wave vector 420-*a* may form the legs of a substantially isosceles triangle. The equal angles of this triangle may be congruent with the angle of incidence and angle of reflection, both measured with respect to the reflective axis 430-*a*. Thus, the hologram recording 405-*a* may reflect light in a substantially mirror-like manner about the reflective axis 430-*a*.

The k-space diagram 410-*b* may illustrate the reflection of an incident light by the hologram recording 405-*b*. The hologram recording 405-*b* may reflect incident light at a plurality of incidence angles that are different than the incidence angles reflected by the hologram recording 405-*a*. The hologram recording 405-*b* may also reflect light at a different wavelength than the hologram recording 405-*a*. The k-space diagram 410-*b* may be a representation of a mirror-like diffraction (which can be referred to as a reflection) of the probe beam by the hologram, where the probe beam angle of incidence with respect to the reflective axis is equal to the diffracted beam angle of reflection with respect to the reflective axis. The k-space diagram 410-*b* has a positive sideband $\Delta n(\bar{k})$ k-space distribution 450-*b* that has an angle measured with respect to the z-axis, equal to that of the reflective axis 430-*b* of hologram recording 405-*b*. The k-space diagram 410-*b* also has a negative sideband $\Delta n(\bar{k})$ k-space distribution 453-*b* that has an angle measured with respect to the z-axis, equal to that of the reflective axis 430-*b*. The k-sphere 440-*b* may represent visible blue light, visible green light, or visible red light. In some embodiments, the k-sphere may represent other wavelengths of electromagnetic radiation, including but not limited to ultraviolet or infrared wavelengths.

The k-space diagram 410-*b* depicts a case where the probe beam 435-*b* produces a diffracted beam k-space distribution 425-*b*, $E_d(\bar{k})$, that is point-like and lies on the probe beam 440-*b* k-sphere. The diffracted beam k-space distribution 425-*b* is produced according to the convolution of Equation (4).

The probe beam 435-*b* has a k-space distribution, $E_p(\bar{k})$, that is also point-like. In this case, the probe beam is said to be "Bragg-matched" to the hologram, and the hologram may produce significant diffraction, even though the probe beam wavelength differs from the wavelength of the recording beams used to record the hologram. The convolution operation may also be represented geometrically by the vector sum $\bar{k}_d = -\bar{k}_p + \bar{K}_{G+}$, where $\bar{k}_d$ represents a diffracted beam wave vector 420-*b*, $\bar{k}_p$ represents a probe beam wave vector 415-*b*, and $\bar{K}_{G+}$ represents a positive sideband grating vector 451-*b*. Vector 445-*b* represents the sum of the probe beam wave vector 415-*b* and the positive sideband grating vector 451-*b* according to the convolution of Equation (4). The k-space diagram 410-*b* also has a negative sideband grating vector 452-*b*.

The probe beam wave vector 415-*b* and the diffracted beam wave vector 420-*b* may form the legs of a substantially isosceles triangle. The equal angles of this triangle may be congruent with the angle of incidence and angle of reflection, both measured with respect to the reflective axis 430-*b*. Thus, the hologram recording 405-*b* may reflect light in a substantially mirror-like manner about the reflective axis 430-*b*. By subjecting optical component 400 including hologram recording 405-*b* to an incoherent light treatment, the reflection of the probe beam may result in a clearer reflected image.

It should be noted that these methods describe possible implementation, and that the operations and the steps may be rearranged or otherwise modified such that other implementations are possible. In some examples, aspects from two or more of the methods may be combined. For example, aspects of each of the methods may include steps or aspects of the other methods, or other steps or techniques described herein.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein given the benefit of the present disclosure. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein throughout the entirety of the specification, should be understood to control over dictionary definitions, definitions in documents incorporated by reference, and/or ordinary meanings of the defined terms. The terms and phases described below are not to be accorded any special meaning by comparison with the other terms and phases described above and throughout the specification. Rather, the terms and phases described below are provided for additional clarity and as further examples of the subject technology in accordance with aspects of the present disclosure.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 221.03.

The term "reflective axis" refers to an axis that bisects an angle of incident light relative to its reflection. The absolute value of an angle of incidence of the incident light relative to the reflective axis is equal to the absolute value of the angle of reflection of the incident light's reflection, relative to the reflective axis. For conventional mirrors, the reflective axis is coincident with surface normal (i.e., the reflective axis is perpendicular to the mirror surface). Conversely, implementations of holographic optical elements according to the present disclosure may have a reflective axis that differs from surface normal, or in some cases may have a reflective axis that is coincident with surface normal. Persons skilled in the art given the benefit of the present disclosure will recognize that a reflective axis angle can be determined by adding an angle of incidence to its respective angle of reflection, and dividing the resulting sum by two. Angles of incidence and angles of reflection can be determined empirically, with multiple measurements (generally three or more) used to generate a mean value.

The term "reflection" and similar terms are used in this disclosure in some cases where "diffraction" might ordinarily be considered an appropriate term. This use of "reflection" is consistent with mirror-like properties exhibited by holographic optical elements and helps avoid potentially confusing terminology. For example, where a hologram recording is said to be configured to "reflect" incident light, a conventional artisan might prefer to say the hologram recording is configured to "diffract" incident light, since hologram recordings are generally thought to act on light by diffraction. However, such use of the term "diffract" would result in expressions such as "incident light is diffracted about substantially constant reflective axes," which could be confusing. Accordingly, where incident light is said to be "reflected" by a hologram recording, persons of ordinary skill in art, given the benefit of this disclosure, will recognize that the hologram recording is in fact "reflecting" the light by a diffractive mechanism. Such use of "reflect" is not without precedent in optics, as conventional mirrors are generally said to "reflect" light despite the predominant role diffraction plays in such reflection. Artisans of ordinary skill thus recognize that most "reflection" includes characteristics of diffraction, and "reflection" by a holographic optical element or components thereof also includes diffraction.

The term "light" refers to electromagnetic radiation familiar to persons skilled in the art. Unless reference is made to a specific wavelength or range of wavelengths, such as "visible light", which refers to a part of the electromagnetic spectrum visible to the human eye, the electromagnetic radiation can have any wavelength.

The terms "hologram" and "holographic grating" refer to a recording of an interference pattern generated by interference between multiple intersecting light beams. In some examples, a hologram or holographic grating may be generated by interference between multiple intersecting light beams where each of the multiple intersecting light beams remains invariant for an exposure time. In other examples, a hologram or holographic grating may be generated by interference between multiple intersecting light beams where an angle of incidence of at least one of the multiple intersecting light beams upon the recording medium is varied while the hologram is being recorded, and/or where wavelengths are varied while the hologram is being recorded (e.g., a complex hologram or complex holographic grating).

The term "sinusoidal volume grating" refers to an optical component which has an optical property, such as refractive index, modulated with a substantially sinusoidal profile throughout a volumetric region. Each (simple/sinusoidal) grating corresponds to a single complementary vector pair in k-space (or a substantially point-like complementary pair distribution in k-space).

The term "eye box" refers to a two-dimensional area outlining a region wherein a human pupil may be placed for viewing the full field of view at a fixed distance from a hologram recording.

The term "exit pupil" refers to a real or virtual aperture passing a beam of light, at its minimum size, emerging from imaging optics. In use, the imaging optics system is typically configured to direct the beam of light toward image capture means. Examples of image capture means include, but are not limited to, a user's eye, a camera, or other photodetector.

The term "recording medium" refers to a physical medium that is configured with a hologram recording for reflecting light. A recording medium may include multiple hologram recordings. In some cases, a recording medium may include substrates or protective layers to protect the recording medium (or recording medium layer). In other cases, the recording medium may consist of a single layer of recording medium.

The term "hologram recording" refers to one or more gratings configured to reflect light. In some examples, a hologram recording may include a set of gratings that share at least one common attribute or characteristic (e.g., a same wavelength of light to which each of the set of gratings is responsive). In some implementations, a hologram recording may include one or more holograms. In other implementations, a hologram recording may include one or more sinusoidal volume gratings. In some examples, the hologram recordings may be uniform with respect to a reflective axis for each of the one or more gratings (e.g., holograms or sinusoidal gratings). Alternatively or additionally, the hologram recordings may be uniform with respect to a length or volume for each of the one or more gratings (e.g., holograms or sinusoidal volume gratings) within the recording medium.

The term "polarization" refers to a property applying to transverse waves that specifies the geometrical orientation of the oscillations. Light in the form of a plane wave in space may be classified as linearly polarized. Implicit in the parameterization of polarized light is the orientation of the reference coordinate frame. A common coordinate system relates to a plane of incidence of the light associated with the incoming propagation direction of the light and the vector perpendicular to the plane of interface. A 'p' polarization state may refer to linearly polarized light whose electric field is along (e.g., parallel) to the plane of incidence. A 's' polarization state may refer to linearly polarized light whose electric field is normal to the plane of incidence. 'P' polarized light may also be referred to as transverse-magnetic (TM), pi-polarized, or tangential plane polarized light. 'S' polarized light may also be referred to as transverse-electric (TE), sigma-polarized, or sagittal plane polarized light.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

In the appended figures, similar components or features may have the same reference label. Further, various components of the same type may be distinguished by following the reference label by a dash and a second label that distinguishes among the similar components. If just the first reference label is used in the specification, the description may be applicable to any one of the similar components having the same first reference label irrespective of the second reference label.

What is claimed is:

1. A method of performing incoherent light treatment, the method comprising:
   securing a recording medium to a securing structure within an internal cavity; and
   delivering light at least partially toward a baffle disposed within the internal cavity.

2. The method of claim 1, wherein the internal cavity is substantially spherical.

3. The method of claim 1, wherein the baffle is a movable baffle.

4. The method of claim 3, wherein delivering light at least partially toward a baffle comprises:
   delivering light at least partially toward a moving baffle disposed within the internal cavity.

5. The method of claim 1, wherein the baffle has a generally parabolic shape.

6. The method of claim 1, wherein a convex surface of the baffle faces a light source disposed within the internal cavity.

7. The method of claim 1, wherein the baffle is disposed within the internal cavity such that a light path from a light source disposed within the internal cavity directed toward the securing structure is at least partially occluded by the baffle.

8. The method of claim 1, wherein a movable light source is disposed within the internal cavity.

9. The method of claim 8, wherein delivering light at least partially toward a baffle comprises:
   delivering light via a moving light source toward a baffle disposed within the internal cavity.

10. The method of claim 1, further comprising:
    securing one or more diffusers to one or more surfaces of the recording medium.

11. The method of claim 10, wherein the one or more diffusers have an index of refraction that is within 0.10 of an index of refraction of the recording medium.

12. The method of claim 10, wherein the one or more diffusers are configured to diffuse light into a surface of the recording medium at one or more angles or incidence corresponding to one or more total internal reflection (TIR) angles of the recording medium.

13. The method of claim 10, wherein the one or more diffusers are configured to diffuse light into a surface of the recording medium at a substantially uniform angle of incidence into the recording medium.

14. The method of claim 10, wherein the one or more diffusers are configured to diffuse light into a surface of the recording medium at one or more angles of incidence corresponding to one or more angles between the critical angle and surface normal of the recording medium.

15. The method of claim 10, wherein the light diffused into the recording medium has a substantially uniform spatial irradiance.

16. The method of claim 10, wherein the light diffused into the recording medium has a substantially uniform temporal irradiance.

17. The method of claim 10, wherein the light diffused into the recording medium has a substantially uniform angular distribution.

18. The method of claim 10, wherein the light diffused into the recording medium has a substantially circular angular distribution.

19. The method of claim 10, wherein the light diffused into the recording medium has a substantially non-circular angle distribution.

20. The method of claim 19, wherein the non-circular angle distribution is aligned to a TIR signal light propagation angle to reduce scatter or haze.

21. The method of claim 10, wherein the one or more diffusers are one or more movable diffusers.

22. The method of claim 21, further comprising:
moving the one or more movable diffusers within the internal cavity; and
delivering light at least partially toward the one or more moving diffusers.

23. The method of claim 1, wherein at least one light source for delivering light is configured to deliver light having a center wavelength less than 450 nm.

24. The method of claim 1, wherein at least one light source for delivering light is configured to deliver light having a bandwidth of at least 10 nm.

25. The method of claim 1, wherein each of at least two light sources for delivering light is configured to deliver substantially coherent light having a bandwidth approximately 10 nm or less.

26. The method of claim 1, wherein a light source for delivering light is configured to deliver light of a uniform irradiance of approximately 50 mW/cm$^2$ to the recording medium.

27. The method of claim 1, wherein the recording medium comprises a hologram, wherein a wavelength used by a recording beam to form the hologram is approximately a same wavelength as a wavelength of the delivered light.

28. The method of claim 1, wherein delivering light at least partially toward a baffle comprises:
delivering light at least partially toward a baffle disposed within the internal cavity for at least 2.5 minutes for interaction with chemically active components of the recording medium.

29. The method of claim 1, wherein delivering light at least partially toward a baffle comprises:
delivering light at least partially toward a baffle disposed within the internal cavity for at least 10 minutes for interaction with chemically active components of the recording medium.

30. The method of claim 1, wherein delivering light at least partially toward a baffle comprises:
delivering light at least partially toward a baffle disposed within the internal cavity corresponding to a dose of approximately 20 Joules.

31. The method of claim 1, wherein delivering light at least partially toward a baffle comprises:
delivering light at least partially toward a baffle disposed within the internal cavity for at duration for a duration corresponding to a time when chemically active components of the recording medium are rendered substantially inactive such that the recording medium is no longer photosensitive.

32. The method of claim 1, wherein the light delivered into the recording medium is substantially spatially incoherent light.

33. The method of claim 1, wherein the light delivered into the recording medium is substantially temporally incoherent light.

34. An incoherent light system comprising:
a securing structure configured to secure a recording medium;
one or more light diffusers on one or more surfaces of the recording medium; and
a light source configured to deliver light at least partially toward the one or more light diffusers.

35. The incoherent light system of claim 34, further comprising:
a housing defining an internal cavity; and
a baffle disposed within the internal cavity,
wherein the securing structure is further configured to reside within the internal cavity at least during operation of the incoherent light system,
wherein the light source is further configured to deliver light at least partially toward the baffle.

36. An incoherent light system, comprising:
a securing structure configured to secure a recording medium within an internal cavity;
a baffle disposed within the internal cavity; and
a light source configured to deliver light at least partially toward the baffle.

* * * * *

UNITED STATES PATENT AND TRADEMARK OFFICE
CERTIFICATE OF CORRECTION

PATENT NO. : 10,289,071 B2  
APPLICATION NO. : 15/817122  
DATED : May 14, 2019  
INVENTOR(S) : Friso Schlottau et al.

Page 1 of 1

It is certified that error appears in the above-identified patent and that said Letters Patent is hereby corrected as shown below:

In the Claims

Column 22 Line 13 In Claim 31, "the internal cavity for at duration for a duration corresponding" should be -the internal cavity for a duration corresponding- Signed and Sealed this  
Thirty-first Day of December, 2019

Andrei Iancu  
*Director of the United States Patent and Trademark Office*